United States Patent
Xu et al.

(10) Patent No.: US 12,153,766 B2
(45) Date of Patent: Nov. 26, 2024

(54) DISPLAY SUBSTRATE AND DISPLAY APPARATUS

(71) Applicants: Beijing BOE Display Technology Co., Ltd., Beijing (CN); BOE Technology Group Co., Ltd., Beijing (CN)

(72) Inventors: Liyan Xu, Beijing (CN); Jiarong Liu, Beijing (CN); Zhixiao Yao, Beijing (CN); Enqiang Zheng, Beijing (CN); Jinglong Yan, Beijing (CN); Haifeng Yu, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/272,358

(22) PCT Filed: Oct. 22, 2021

(86) PCT No.: PCT/CN2021/125513
§ 371 (c)(1),
(2) Date: Jul. 14, 2023

(87) PCT Pub. No.: WO2022/205849
PCT Pub. Date: Oct. 6, 2022

(65) Prior Publication Data
US 2024/0069680 A1     Feb. 29, 2024

(30) Foreign Application Priority Data

Mar. 31, 2021   (CN) .......................... 202110351180.8

(51) Int. Cl.
G06F 3/044     (2006.01)
G06F 3/041     (2006.01)
H01L 27/12     (2006.01)

(52) U.S. Cl.
CPC .......... *G06F 3/0445* (2019.05); *G06F 3/0412* (2013.01); *G06F 3/0418* (2013.01); *H01L 27/1244* (2013.01); *G06F 2203/04111* (2013.01)

(58) Field of Classification Search
CPC ...... G06F 3/0412; G06F 3/0418; G06F 3/445; G06F 3/446
(Continued)

(56) References Cited

U.S. PATENT DOCUMENTS

2016/0231629 A1   8/2016   Xu
2018/0233515 A1   8/2018   Choi
(Continued)

FOREIGN PATENT DOCUMENTS

CN   103824866 A   5/2014
CN   106128950 A   11/2016
CN   112258991 A   1/2021

OTHER PUBLICATIONS

CN202120663303.7 first office action.
PCT/CN2021/125513 international search report.

*Primary Examiner* — Calvin C Ma
(74) *Attorney, Agent, or Firm* — IPro, PLLC

(57) ABSTRACT

The present application discloses a display substrate and a display apparatus. The display substrate includes: a base substrate, a first conductive layer, first insulating layer, second conductive layer, second insulating layer, and third conductive layer ; the first conductive layer includes gate lines; the second conductive layer includes touch electrode wires; the orthographic projection of the touch electrode wires intersects with the orthographic projection of the gate lines; the second insulating layer has a first via hole, the third conductive layer is electrically connected to the touch electrode wires by the first via hole; the first via hole includes an upper opening and a lower opening communicating with (Continued)

each other, the lower opening is close to the base substrate, the upper opening is close to the third conductive layer; the orthographic projection of the lower opening does not overlap with the orthographic projection of the edge of the gate lines.

20 Claims, 7 Drawing Sheets

(58) Field of Classification Search
USPC .................................................. 345/173, 174
See application file for complete search history.

(56) References Cited

U.S. PATENT DOCUMENTS

2018/0314120 A1* 11/2018 Peng ..................... G06F 3/0412
2020/0335053 A1* 10/2020 Yoshida ................. G02F 1/1368
2022/0157857 A1* 5/2022 Fu ....................... H01L 27/1244

* cited by examiner

DISPLAY SUBSTRATE AND DISPLAY APPARATUS

CROSS REFERENCE TO RELATED APPLICATION

The present disclosure is a National Stage of International Application No. PCT/CN2021/125513, filed on Oct. 22, 2021, which claims the priority of Chinese Patent Application No. 202110351180.8, filed with the Chinese Patent Office on Mar. 31, 2021 and entitled "DISPLAY SUBSTRATE AND DISPLAY DEVICE", both of which are incorporated in their entireties herein by reference.

TECHNICAL FIELD

The present disclosure relates to the technical field of display, and in particular to a display substrate and a display device.

BACKGROUND

The touch and display driver integration (TDDI) display product distinctively integrates a touch chip and a display chip into a whole. Accordingly, a panel is endowed with a thinner appearance, brighter display, and a narrower frame. The TDDI products are increasingly popular and highly demanded. In addition, increasing requirements on quality are imposed. However, owing to electrostatic discharge (ESD), a wide range of existing small-sized TDDI products suffer from a display function defect at clients and market ends. As a common defect affecting a picture quality for a long time, ESD can hardly be prevented and mostly occur in a progressive manner. Consequently, the picture quality and brand image will be dramatically affected once the defective products flood into the market.

SUMMARY

The present disclosure provides the following technical solutions: a display substrate includes: a substrate, and a first conductive layer, a first insulative layer, a second conductive layer, a second insulative layer, and a third conductive layer which are sequentially arranged on the substrate; where the first conductive layer includes a plurality of gate lines, and the second conductive layer includes a plurality of touch electrode wires, an orthographic projection, on the substrate, of the touch electrode wire intersecting with an orthographic projection, on the substrate, of the gate line; the second insulative layer is provided with a first via hole, and the third conductive layer is electrically connected to the touch electrode wire through the first via hole; and the first via hole includes an upper opening and a lower opening which are in communication with each other, the lower opening being close to the substrate, the upper opening being close to the third conductive layer, and an orthographic projection, on the substrate, of the lower opening not overlapping an orthographic projection, on the substrate, of an edge of the gate line.

Alternatively, the gate line includes an intersection section, an orthographic projection, on the substrate, of the intersection section intersecting with the orthographic projection, on the substrate, of the touch electrode wire; and an orthographic projection, on the substrate, of an edge of the intersection section is arranged around the orthographic projection, on the substrate, of the lower opening.

Alternatively, in an extension direction of the touch electrode wire, the intersection section has a greater width than the lower opening; and the orthographic projection, on the substrate, of the lower opening is positioned within the orthographic projection, on the substrate, of the intersection section.

Alternatively, the orthographic projection, on the substrate, of the lower opening is positioned within the orthographic projection, on the substrate, of the touch electrode wire.

Alternatively, the touch electrode wire includes a boss and two wire sections positioned on two sides of the boss, respectively, in an extension direction perpendicular to the touch electrode wire, the boss having a greater width than the two wire sections; and the orthographic projection, on the substrate, of the lower opening is positioned within an orthographic projection, on the substrate, of the boss.

Alternatively, the intersection section is of a continuous entire-layer structure.

Alternatively, in the extension direction of the touch electrode wire, the intersection section has a smaller width than the boss.

Alternatively, the intersection section is provided with an avoidance opening, the orthographic projection, on the substrate, of the lower opening being positioned within an orthographic projection, on the substrate, of the avoidance opening.

Alternatively, the avoidance opening is a closed opening.

Alternatively, the orthographic projection, on the substrate, of the boss is positioned within the orthographic projection, on the substrate, of the avoidance opening.

Alternatively, the orthographic projection, on the substrate, of the lower opening is positioned on one side of the orthographic projection, on the substrate, of the intersection section.

Alternatively, the orthographic projection, on the substrate, of the edge of the intersection section is positioned between an orthographic projection, on the substrate, of an edge of the upper opening and an orthographic projection, on the substrate, of an edge of the lower opening.

Alternatively, an orthographic projection, on the substrate, of the upper opening is positioned within the orthographic projection, on the substrate, of the intersection section.

Alternatively, the second conductive layer is a source-drain electrode layer and further includes a data signal line, the data signal line having the same extension direction as the touch electrode wire; and the third conductive layer is a common electrode layer.

Alternatively, the second insulative layer includes an inorganic passivation layer and an organic planarization layer, the organic planarization layer being positioned between the second conductive layer and the inorganic passivation layer; and the inorganic passivation layer is provided with a second via hole, and the organic planarization layer is provided with a third via hole, the second via hole being in communication with the third via hole, and the first via hole including the second via hole and the third via hole.

Alternatively, an orthographic projection, on the substrate, of the second via hole is positioned within an orthographic projection, on the substrate, of the third via hole.

Alternatively, the gate line and the touch electrode wire are made of copper.

A display device includes the display substrate according to any one of the above.

DETAILED DESCRIPTION

Figure 1:
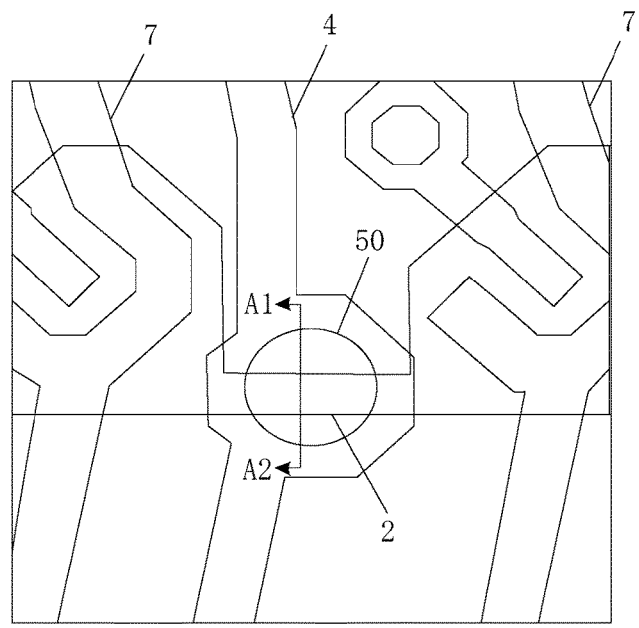
FIG. 1 is a partial schematic structural diagram of a display substrate in the related art.
Figure 2:
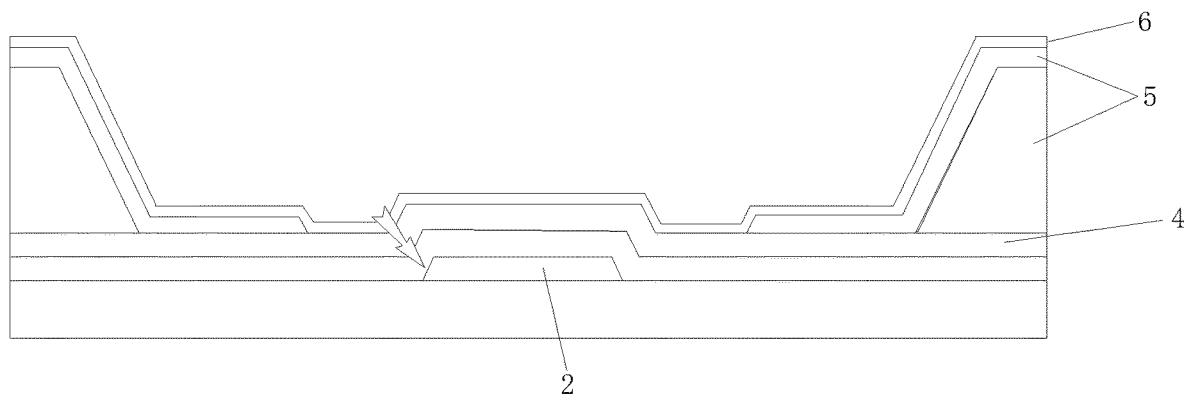
FIG. 2 is a schematic structural diagram of a partial section in direction A1-A2 of the display substrate in FIG. 1.

Specifically, with reference to FIGS. 1 and 2, in a touch and display driver integration (TDDI) display product in the related art, a touch electrode wire (Tx) 4 is in the same layer as a data line (SD line) 7, and intersects with a gate line 2 to form an inductive capacitive circuit. Specifically, the Tx 4 is electrically connected to a common electrode layer 6 through a via hole 50 of an insulative layer 5. In order to avoid affecting an aperture ratio of the display product, the via hole 50 is arranged at an intersection between the Tx 4 and the gate line 2. Static electricity is likely to be accumulated in an etching process of the via hole 50. A climbing position, at an edge of the gate line 2 of the Tx 4, in the via hole 50 is a weak antistatic point. Accordingly, electrostatic discharge (ESD) is likely to be generated, resulting in a short circuit between the Tx 4 and the gate line 2, and further, a line grid and/or a cross grain defect.

In view of the research findings of the above inventors, the present disclosure provides a design solution of a display substrate, so as to solve a display function defect, caused by ESD, of a TDDI display product.

The technical solutions in the embodiments of the present disclosure are clearly and completely described below with reference to the accompanying drawings in the embodiments of the present disclosure. Apparently, the described embodiments are merely some embodiments rather than all embodiments of the present disclosure. Based on the embodiments of the present disclosure, all other embodiments derived by those of ordinary skill in the art without making creative efforts fall within the scope of protection of the present disclosure.

A display substrate is provided in an embodiment of the present disclosure. As shown in FIGS. 3-13, the display substrate includes: a substrate 1, and a first conductive layer, a first insulative layer 3, a second conductive layer, a second insulative layer 5, and a third conductive layer 6 which are sequentially arranged on the substrate 1.

The first conductive layer includes a plurality of gate lines 2, and the second conductive layer includes a plurality of touch electrode wires 4, an orthographic projection, on the substrate 1, of the touch electrode wire 4 intersecting with an orthographic projection, on the substrate 1, of the gate line 2.

The second insulative layer 5 is provided with a first via hole 50, and the third conductive layer 6 is electrically connected to the touch electrode wire 4 through the first via hole 50.

The first via hole 50 includes an upper opening 501 and a lower opening 502 which are in communication with each other, the lower opening 502 being close to the substrate 1, the upper opening 501 being close to the third conductive layer 6, and an orthographic projection, on the substrate 1, of the lower opening 502 not overlapping an orthographic projection, on the substrate 1, of an edge of the gate line 2.

In the display substrate according to embodiments of the present disclosure, the touch electrode wire 4 intersects with and the gate line 2 to form a touch inductive capacitive circuit. The touch electrode wire 4 is electrically connected to the third conductive layer 6 through the first via hole 50 to realize electrical signal access. The orthographic projection of the lower opening 502 (the opening on one side close to the substrate 1) of the first via hole 50 does not overlap the orthographic projection of the edge of the gate line 2. Further, there is no step or level difference, caused by the edge of the gate line 2, in the lower opening 502 of the first via hole 50, and thus electrostatic discharge is unlikely to be generated in the first via hole 50. Therefore, ESD at a touch electrode connection hole of the TDDI product can be completely diminished, a display defect caused by a short circuit between the touch electrode wire 4 and the gate line 2 of the TDDI product can be effectively diminished, and a product yield can be improved.

In the embodiments of the present disclosure, the edge of the gate line refers to an edge of a film layer pattern of the gate line, and is not limited to extension edges on two sides of the gate line. For example, if another pattern is included in the gate line, an edge of the pattern also belongs to the edges of the gate line.

In a some embodiments, as shown in FIGS. 3, 5, 7, 9, 11, 12, and 13, in the display substrate according to the embodiment of the present disclosure, the gate line 2 includes an intersection section 20, an orthographic projection, on the substrate, of the intersection section 20 intersecting with the orthographic projection, on the substrate, of the touch electrode wire 4.

Specifically, an orthographic projection, on the substrate, of an edge of the intersection section 20 is arranged around the orthographic projection, on the substrate, of the lower opening 502.

In some embodiments of the present disclosure, the first via hole 50 is arranged at an intersection position between the gate line 2 and the touch electrode wire 4, which does not affect the aperture ratio of the display substrate. Moreover, the orthographic projection of the edge of the intersection section 20 of the gate line 2 is arranged around the orthographic projection of the lower opening 502, that is, the edge of the gate line 2 avoids a position of the lower opening 502. Further, there is no step or level difference (with reference to the sectional views in FIGS. 4 and 6), caused by the edge of the gate line 2, in the lower opening 502. Also, electrostatic discharge is unlikely to be generated in the lower opening 502. Therefore, the short circuit between the touch electrode wire 4 and the gate line 2 in the first via hole can be prevented, the display defect caused by ESD can be completely diminished, and the product yield can be improved.

In some embodiments, as shown in FIGS. 3, 5, 7, 9, and 11, the orthographic projection, on the substrate, of the lower opening 502 is positioned within the orthographic projection, on the substrate, of the touch electrode wire 4.

Exemplarily, as shown in FIGS. 3, 5, 7, 9, and 11, the touch electrode wire 4 includes a boss 40 and two wire sections positioned on two sides of the boss 40, respectively. In an extension direction perpendicular to the touch electrode wire 4, the boss 40 has a greater width than the two wire sections. The orthographic projection, on the substrate, of the lower opening 502 is positioned within the orthographic projection, on the substrate, of the boss 40.

In some embodiments, with reference to FIGS. 4, 6, 8, and 10, the first via hole is used as an electrical connection hole between the third conductive layer 6 and the touch electrode wire 4 and required to be arranged above the touch electrode wire 4. The orthographic projection of the lower opening of the first via hole is arranged within the orthographic projection of the touch electrode wire 4. Therefore, the connection yield between the third conductive layer 6 and the touch electrode wire 4 can be ensured. With reference to FIGS. 3, 5, 7, 9, and 11, a section, at the position of the first via hole 50, of the touch electrode wire 4 is provided with the boss 40 with a greater width, and the orthographic projection of the lower opening 502 is arranged within the orthographic projection of the boss 40. Therefore, a manufacturing process of the first via hole 50 can be simplified, a manufacturing yield of the first via hole 50 can be improved, and the connection yield between the third conductive layer 6 and the touch electrode wire 4 can be further enhanced.

In some embodiments, as shown in FIGS. 3, 5, 7, and 9, in an extension direction of the touch electrode wire 4, the intersection section 20 of the gate line 2 has a greater width than the lower opening 502. The orthographic projection, on the substrate, of the lower opening 502 is positioned within the orthographic projection, on the substrate, of the intersection section 20.

Figure 5:
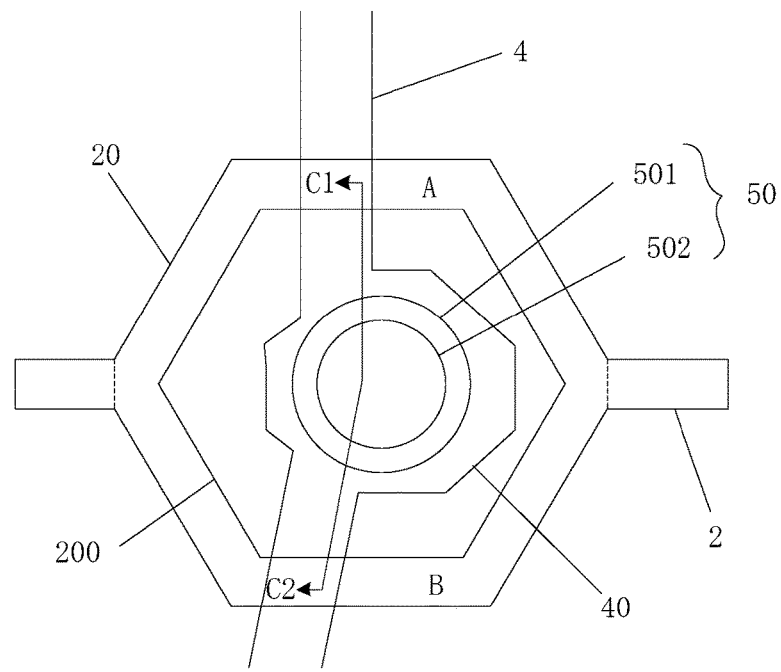
FIG. 5 is a partial schematic structural diagram of a display substrate according to another embodiment of the present disclosure.
Figure 6:
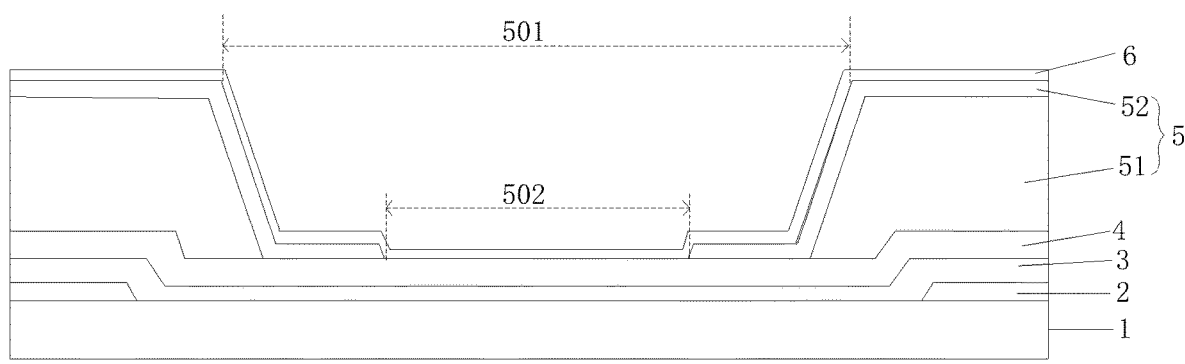
FIG. 6 is a schematic structural diagram of a partial section in direction C1-C2 of the display substrate in FIG. 5.
Figure 7:
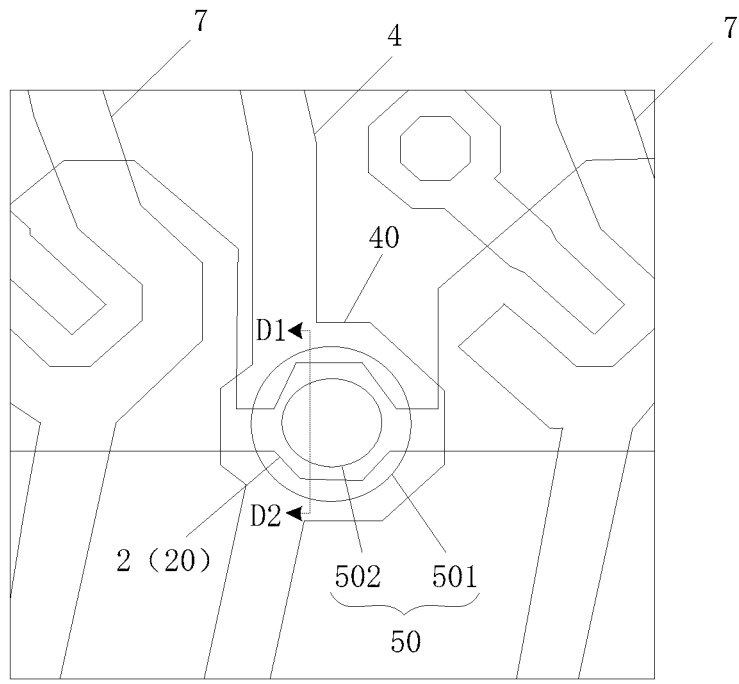
FIG. 7 is a partial schematic structural diagram of a display substrate according to yet another embodiment of the present disclosure.
Figure 9:
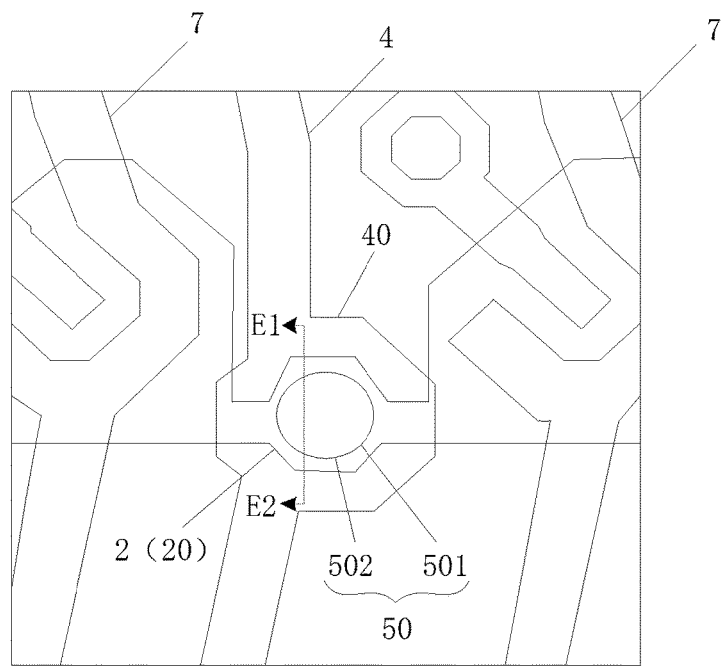
FIG. 9 is a partial schematic structural diagram of a display substrate according to still another embodiment of the present disclosure.

Exemplarily, as shown in FIGS. 5, 7, and 9, the intersection section 20 of the gate line 2 may have a greater width than a left gate line 2 section and a right gate line section connected thereto.

Figure 3:
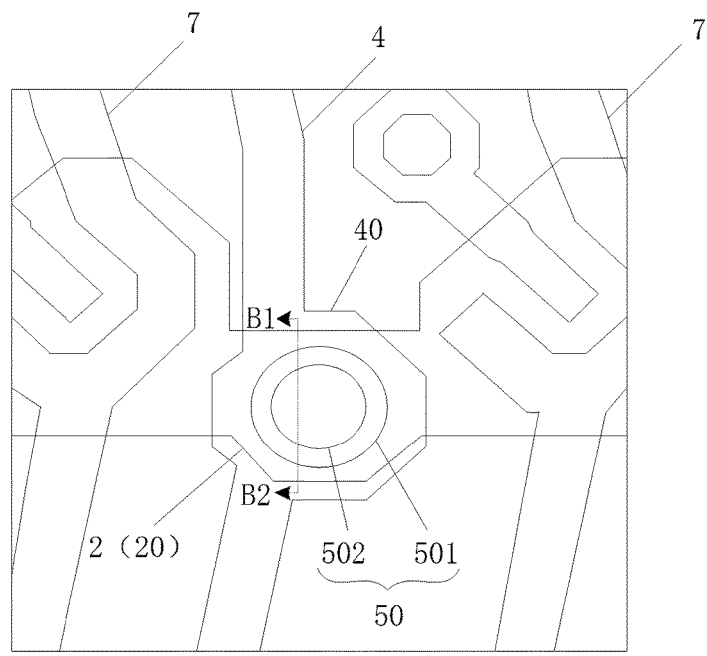
FIG. 3 is a partial schematic structural diagram of a display substrate according to an embodiment of the present disclosure.
Figure 4:
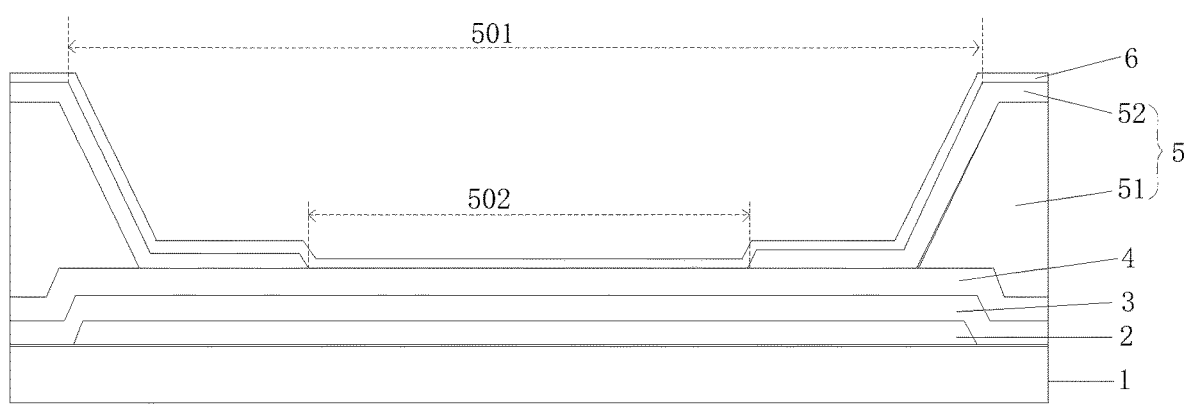
FIG. 4 is a schematic structural diagram of a partial section in direction B1-B2 of the display substrate in FIG. 3.

On the basis of the above embodiment, in an implementation mode, as shown in FIG. 3, the intersection section 20 of the gate line 2 is of a continuous entire-layer structure.

In some embodiments, as shown in FIGS. 3, 7, and 9, the intersection section 20 is a continuous film layer. In the extension direction of the touch electrode wire 4, the film layer has a greater width than the lower opening 502. An edge of the film layer surrounds the lower opening 502. In this case, the film layer, the intersection section 20, is used as a platform, an entire lower opening 502 is positioned on the platform, and there is no step or level difference (with reference to the sectional views in FIGS. 4, 8, and 10) in the lower opening 502. Further, electrostatic discharge is unlikely to be generated in the lower opening 502. Therefore, the short circuit between the touch electrode wire 4 and the gate line 2 in the lower opening 502 can be prevented, the display defect caused by ESD can be effectively diminished, and the product yield can be improved.

In addition, such an arrangement may increase the coupling capacitance of part of the touch electrode wire 4, but will not affect the characteristics of the capacitive circuit and the application of a touch function. Specifically, for example, this design may be applied to 10.3-inch and/or 10.1-inch copper metal wire products.

Exemplarily, as shown in FIGS. 3, 7, and 9, in the extension direction of the touch electrode wire 4, the intersection section 20 of the gate line 2 has a smaller width than the boss 40 of the touch electrode wire 4.

Certainly, in practical applications, the intersection section of the gate line may also have a greater width than the boss of the touch electrode wire, which may be specifically selected according to the requirements of a pixel aperture ratio and a process demand.

In another implementation mode, as shown in FIG. 5, the intersection section 20 of the gate line 2 is provided with an avoidance opening 200. The orthographic projection, on the substrate, of the lower opening 502 is positioned within the orthographic projection, on the substrate, of the avoidance opening 200.

In some embodiments, as shown in FIG. 5, the film layer, the intersection section 20, is provided with a pattern of the avoidance opening 200. Further, the film layer, the intersection section 20, is provided with an outer side edge and an inner side edge (an edge of the avoidance opening 200). Since the orthographic projection of the lower opening 502 is positioned within the orthographic projection of the avoidance opening 200, the outer side edge and an inner side opening edge of the intersection section 20 are arranged around the lower opening 502. In this case, no step or level difference (with reference to the sectional view in FIG. 6) is formed in the lower opening 502. Further, electrostatic discharge is unlikely to be generated in the lower opening 502. Therefore, the short circuit between the touch electrode wire 4 and the gate line 2 in the lower opening 502 can be prevented, the display defect caused by ESD can be effectively diminished, and the product yield can be improved.

Exemplarily, as shown in FIG. 5, the avoidance opening 200 is a closed opening. In this case, the outer side edge and the inner side opening edge of the intersection section 20 are closed and annular, and arranged around the lower opening 502. In other words, the lower opening 502 divides the intersection section 20 into two branches A and B in this case. When a defect occurs in one branch, the normal operation can be maintained through the other branch, so as to ensure the product yield. For example, when ESD is generated at a position where branch A of the intersection section 20 overlaps the touch electrode wire 4, the defect can be eliminated by cutting off branch A. In this case, branch B of the intersection section 20 can maintain the normal operation without affecting normal display.

Exemplarily, branch A and branch B have a smaller width than two gate line sections connected to the left and right of the intersection section 20. In this way, the influence from the intersection section 20 on the aperture ratio of the display substrate can be reduced as much as possible.

Certainly, the avoidance opening may also be a semi-closed opening like a dented notch and designed as specifically required in practical applications.

Exemplarily, as shown in FIG. 5, the orthographic projection, on the substrate, of the boss 40 of the touch electrode wire 4 is positioned within the orthographic projection, on the substrate, of the avoidance opening 200. In this case, orthographic projections of branch A and branch B of the intersection section 20 do not overlap the orthographic projection of the boss 40 of the touch electrode wire 4. In this way, the risk of the short circuit between the touch electrode wire 4 and the gate line 2 can be reduced, and the yield of a touch circuit can be ensured.

In some embodiments, the upper opening and the lower opening of the first via hole may be the same in size or not.

Figure 10:
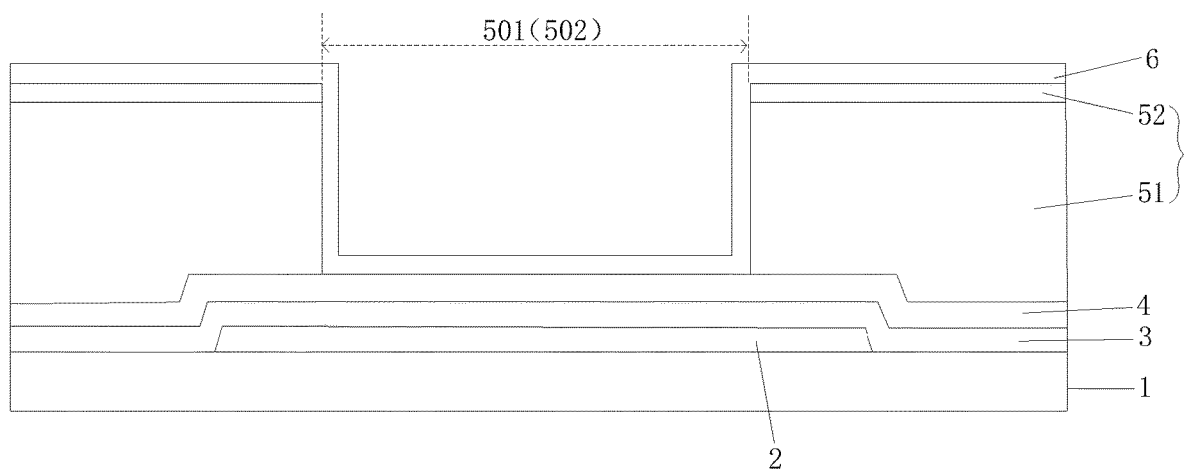
FIG. 10 is a schematic structural diagram of a partial section in direction E1-E2 of the display substrate in FIG. 9.

Exemplarily, as shown in FIGS. 9 and 10, the upper opening 501 of the first via hole 50 may have the same size as the lower opening 502, and the orthographic projection, on the substrate 1, of the upper opening 501 overlaps the orthographic projection, on the substrate 1, of the lower opening 502.

Alternatively, as shown in FIGS. 3, 4, 7, and 8, the upper opening 501 may have a greater size than the lower opening 502, and the orthographic projection, on the substrate 1, of the lower opening 502 is positioned within the orthographic projection, on the substrate 1, of the upper opening 501.

Alternatively, the upper opening may have a smaller size than the lower opening, and the orthographic projection, on the substrate, of the upper opening is positioned within the orthographic projection, on the substrate, of the lower opening.

In some embodiments, the orthographic projection, on the substrate 1, of the upper opening 501 may be positioned within the orthographic projection, on the substrate 1, of the intersection section 20. For example, as shown in FIGS. 9 and 10, the orthographic projection, on the substrate 1, of the upper opening 501 overlaps the orthographic projection, on the substrate 1, of the lower opening 502, and the two orthographic projections are positioned within the orthographic projection, on the substrate 1, of the intersection section 20.

Figure 8:
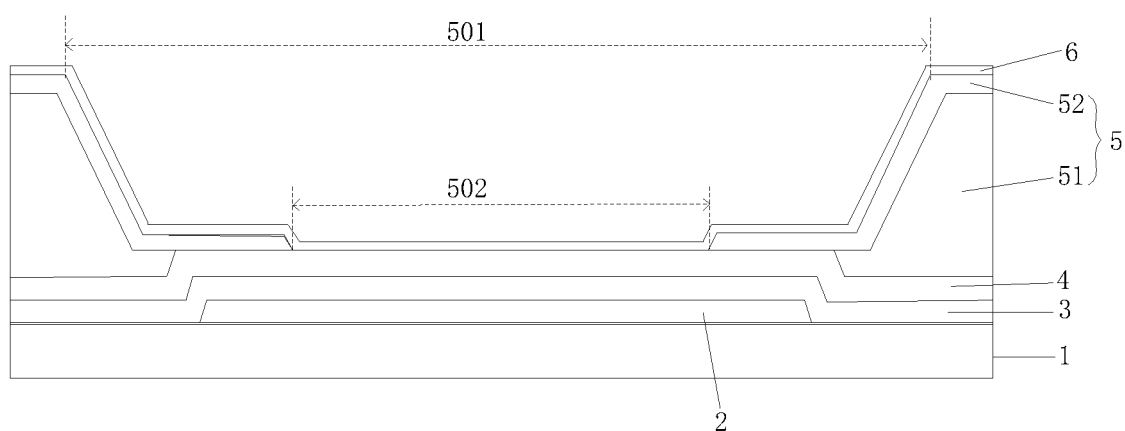
FIG. 8 is a schematic structural diagram of a partial section in direction D1-D2 of the display substrate in FIG. 7.

In yet another specific embodiment, as shown in FIGS. 7 and 8, the orthographic projection, on the substrate 1, of the edge of the intersection section 20 is positioned between an orthographic projection, on the substrate 1, of an edge of the upper opening 501 and an orthographic projection, on the substrate 1, of an edge of the lower opening 502. In other words, the edge of the intersection section 20 surrounds the edge of the lower opening 502, and the edge of the upper opening 501 surrounds the edge of the intersection section 20.

Figure 11:
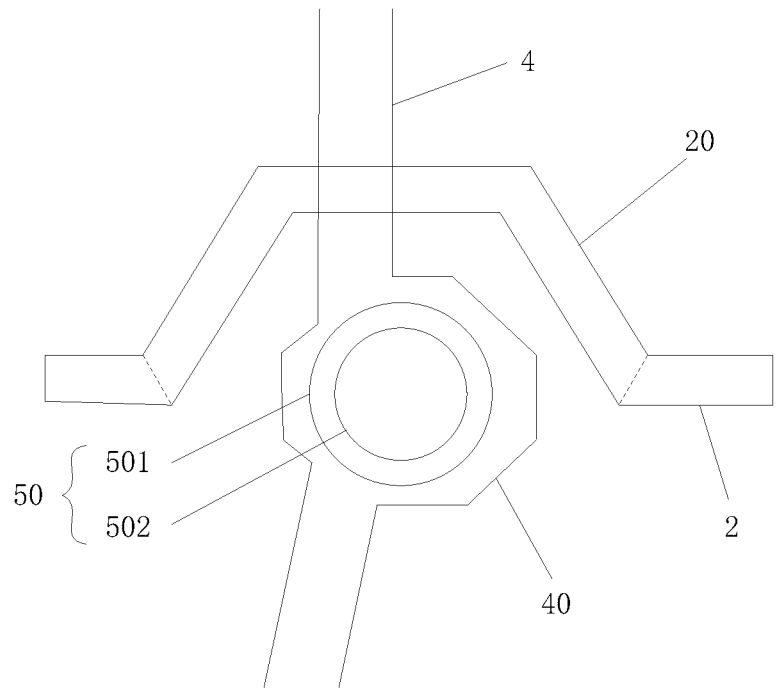
FIG. 11 is a partial schematic structural diagram of a display substrate according to yet another embodiment of the present disclosure.
Figure 12:
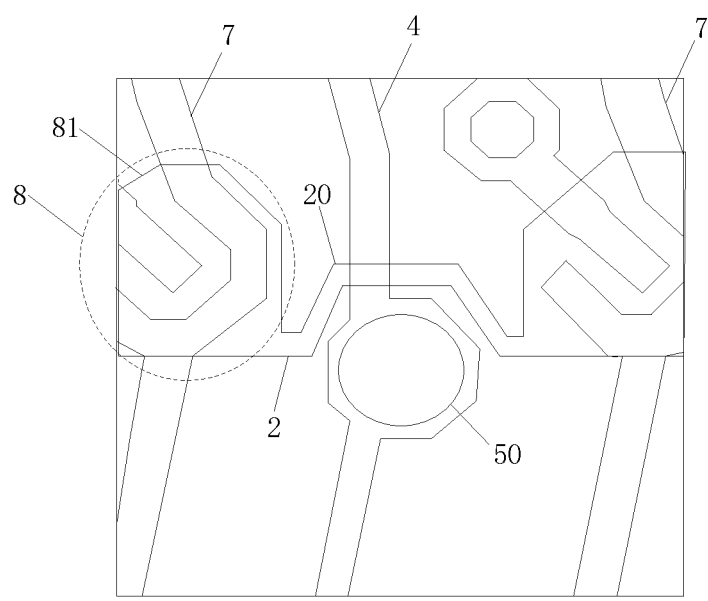
FIG. 12 is a partial schematic structural diagram of a display substrate according to yet another embodiment of the present disclosure.
Figure 13:
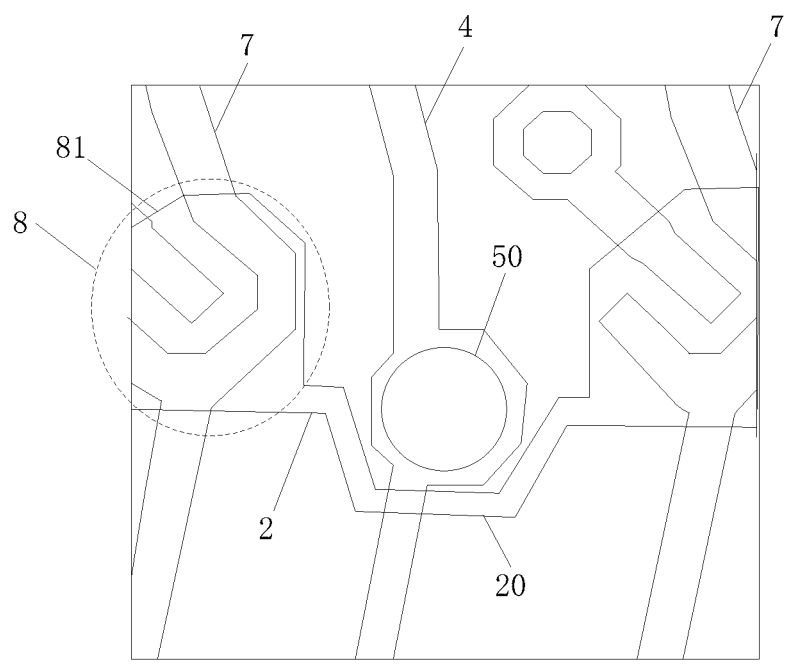
FIG. 13 is a partial schematic structural diagram of a display substrate according to still another embodiment of the present disclosure.

In some embodiments, as shown in FIGS. 11, 12, and 13, the orthographic projection, on the substrate, of the lower opening 502 of the first via hole 50 is positioned on one side of the orthographic projection, on the substrate, of the intersection section 20.

In other words, the orthographic projection of an entire intersection section 20 bypasses the orthographic projection of the lower opening 502 of the first via hole 50, so as to prevent the edge of the intersection section 20 from forming the step or level difference in the lower opening 502. Therefore, ESD is prevented from being generated in the lower opening 502, the display defect caused by ESD can be effectively diminished, and the product yield can be improved.

Exemplarily, as shown in FIGS. 11, 12, and 13, in the extension direction of the touch electrode wire 4, the intersection section 20 of the gate line 2 has a smaller width than the lower opening 502.

Exemplarily, as shown in FIG. 11, the intersection section 20 of the gate line 2 may have substantially the same width as the left gate line section and the right gate line section connected thereto, and the edge of the intersection section 20 is arranged around the lower opening 502.

Exemplarily, as shown in FIGS. 12 and 13, the display substrate according to the embodiment of the present disclosure further includes a thin film transistor (TFT) 8. A gate 81 of the TFT 8 is connected to the gate line 2. Specifically, as shown in FIG. 12, the intersection section 20 may be positioned at one side, close to the TFT 8, of the first via hole 20. In this way, concentrated routing can be realized, and the influence on the aperture ratio can be reduced. Alternatively, as shown in FIG. 13, the intersection section 20 may also be positioned on one side, away from the TFT 8, of the first via hole 20. In this way, dispersed routing can be realized, and the interference between the intersection section 20 and the TFT 8, such as coupling capacitance and ESD, can be avoided.

Certainly, in some embodiments of the present disclosure, sizes and orthographic projection positions of the boss of the touch electrode wire and the intersection section of the gate line, etc. are not limited to the above embodiment and may be adjusted as required in practical applications.

In some embodiments, in the display substrate provided by the present disclosure, as shown in FIGS. 3, 7, and 9, the second conductive layer is a source-drain electrode layer and further includes a data signal line 7, the data signal line 7 having the same extension direction as the touch electrode wire 4.

Exemplarily, as shown in FIGS. 4, 6, 8, and 10, the third conductive layer 6 is a common electrode layer.

Exemplarily, as shown in FIGS. 4, 6, 8, and 10, the second insulative layer 5 includes an inorganic passivation layer 52 and an organic planarization layer 51, the organic planarization layer 51 being positioned between the second conductive layer and the inorganic passivation layer 52.

Exemplarily, as shown in FIGS. 4, 6, 8, and 10, the inorganic passivation layer 52 is provided with a second via hole, and the organic planarization layer 51 is provided with a third via hole, the second via hole being in communication with the third via hole, and the first via hole 50 including the second via hole and the third via hole. In other words, the third conductive layer 6 is electrically connected to the touch electrode wire 4 through the second via hole and the third via hole.

Exemplarily, an orthographic projection, on the substrate, of the second via hole is positioned within an orthographic projection, on the substrate, of the third via hole.

In some embodiments, in the display substrate provided by the present disclosure, the gate line and the touch electrode wire are made of metal materials. Exemplarily, the gate line and the touch electrode wire are made of copper.

In addition, a display device is further provided in an embodiment of the present disclosure. The display device includes the display substrate according to any one of the above.

The display device according to embodiments of the present disclosure employs the touch and display driver integration (TDDI) design. Accordingly, the display device is endowed with a thinner appearance, brighter display, and a narrower frame. The display device is unlikely to generate ESD. Therefore, a display defect caused by a short circuit between a touch electrode wire and a gate line can be effectively diminished, and the product yield can be improved.

Specifically, the display device according to the embodiment of the present disclosure may be applied to a mobile phone, a tablet computer, a display, etc.

It is to be noted that in some embodiments of the present disclosure, the display substrate and the display device may further include other structures, which may be determined as actually required and will not be limited in the embodiments of the present disclosure. In addition, all the embodiments of the present disclosure are merely exemplary of the specific implementation solutions, and the inventive solution of the present disclosure is not limit to the above embodiments.

Apparently, those skilled in the art can make various modifications and variations to the embodiments of the present application without departing from the spirit and scope of the present application. In this way, if these modifications and variations to the present disclosure fall within the scope of the claims of the present disclosure and their equivalents, the present disclosure is also intended to encompass these modifications and variations.

What is claimed is:

1. A display substrate, comprising: a substrate, and a first conductive layer, a first insulative layer, a second conductive layer, a second insulative layer, and a third conductive layer which are sequentially arranged on the substrate; wherein
the first conductive layer comprises a plurality of gate lines, and the second conductive layer comprises a plurality of touch electrode wires, an orthographic projection, on the substrate, of the touch electrode wire intersecting with an orthographic projection, on the substrate, of the gate line;
the second insulative layer is provided with a first via hole, and the third conductive layer is electrically connected to the touch electrode wire through the first via hole; and
the first via hole comprises an upper opening and a lower opening which are in communication with each other, the lower opening being close to the substrate, the upper opening being close to the third conductive layer, and an orthographic projection, on the substrate, of the lower opening not overlapping an orthographic projection, on the substrate, of an edge of the gate line.

2. The display substrate according to claim 1, wherein the gate line comprises an intersection section, an orthographic projection, on the substrate, of the intersection section intersecting with the orthographic projection, on the substrate, of the touch electrode wire; and
an orthographic projection, on the substrate, of an edge of the intersection section is arranged around the orthographic projection, on the substrate, of the lower opening.

3. The display substrate according to claim 2, wherein in an extension direction of the touch electrode wire, a width of the intersection section is greater than a width of the lower opening; and
the orthographic projection, on the substrate, of the lower opening is positioned within the orthographic projection, on the substrate, of the intersection section.

4. The display substrate according to claim 3, wherein the orthographic projection, on the substrate, of the lower opening is positioned within the orthographic projection, on the substrate, of the touch electrode wire.

5. The display substrate according to claim 4, wherein the touch electrode wire comprises a boss and two wire sections positioned on two sides of the boss, respectively, in an extension direction perpendicular to the touch electrode wire, a width of the boss is greater than a width of the two wire sections; and the orthographic projection, on the substrate, of the lower opening is positioned within an orthographic projection, on the substrate, of the boss.

6. The display substrate according to claim 5, wherein the intersection section is of a continuous entire-layer structure.

7. The display substrate according to claim 6, wherein in the extension direction of the touch electrode wire, a width of the intersection section is less than a width of the boss.

8. The display substrate according to claim 5, wherein the intersection section is provided with an avoidance opening, the orthographic projection, on the substrate, of the lower opening being positioned within an orthographic projection, on the substrate, of the avoidance opening.

9. The display substrate according to claim 8, wherein the avoidance opening is a closed opening.

10. The display substrate according to claim 8, wherein the orthographic projection, on the substrate, of the boss is positioned within the orthographic projection, on the substrate, of the avoidance opening.

11. The display substrate according to claim 2, wherein the orthographic projection, on the substrate, of the lower opening is positioned on one side of the orthographic projection, on the substrate, of the intersection section.

12. The display substrate according to claim 2, wherein the orthographic projection, on the substrate, of the edge of the intersection section is positioned between an orthographic projection, on the substrate, of an edge of the upper opening and an orthographic projection, on the substrate, of an edge of the lower opening.

13. The display substrate according to claim 2, wherein an orthographic projection, on the substrate, of the upper opening is positioned within the orthographic projection, on the substrate, of the intersection section.

14. The display substrate according to claims 1, wherein the second conductive layer is a source-drain electrode layer and further comprises a data signal line, an extension direction of the data signal line is identical to an extension direction of the touch electrode wire; and
the third conductive layer is a common electrode layer.

15. The display substrate according to claim 14, wherein the second insulative layer comprises an inorganic passivation layer and an organic planarization layer, the organic planarization layer being positioned between the second conductive layer and the inorganic passivation layer; and
the inorganic passivation layer is provided with a second via hole, and the organic planarization layer is provided with a third via hole, the second via hole being in communication with the third via hole, and the first via hole comprising the second via hole and the third via hole.

16. The display substrate according to claim 15, wherein an orthographic projection, on the substrate, of the second via hole is positioned within an orthographic projection, on the substrate, of the third via hole.

17. The display substrate according to claim 14, wherein a material of the gate line comprises copper, and a material of the touch electrode wire comprises copper.

18. A display device, comprising a display substrate, wherein the display substrate comprises: a substrate, and a first conductive layer, a first insulative layer, a second conductive layer, a second insulative layer, and a third conductive layer which are sequentially arranged on the substrate; wherein
the first conductive layer comprises a plurality of gate lines, and the second conductive layer comprises a plurality of touch electrode wires, an orthographic projection, on the substrate, of the touch electrode wire intersecting with an orthographic projection, on the substrate, of the gate line;

the second insulative layer is provided with a first via hole, and the third conductive layer is electrically connected to the touch electrode wire through the first via hole; and the first via hole comprises an upper opening and a lower opening which are in communication with each other, the lower opening being close to the substrate, the upper opening being close to the third conductive layer, and an orthographic projection, on the substrate, of the lower opening not overlapping an orthographic projection, on the substrate, of an edge of the gate line.

19. The display device according to claim 18, wherein the gate line comprises an intersection section, an orthographic projection, on the substrate, of the intersection section intersecting with the orthographic projection, on the substrate, of the touch electrode wire; and an orthographic projection, on the substrate, of an edge of the intersection section is arranged around the orthographic projection, on the substrate, of the lower opening.

20. The display device according to claim 19, wherein in an extension direction of the touch electrode wire, a width of the intersection section is greater than a width of the lower opening; and the orthographic projection, on the substrate, of the lower opening is positioned within the orthographic projection, on the substrate, of the intersection section.

\* \* \* \* \*